(12) United States Patent
Christ

(10) Patent No.: US 7,860,477 B2
(45) Date of Patent: Dec. 28, 2010

(54) SELF-CALIBRATING FILTER

(75) Inventor: Volker Christ, Neuss (DE)

(73) Assignee: Infineon Technologies AG, Neubiberg (DE)

( * ) Notice: Subject to any disclaimer, the term of this patent is extended or adjusted under 35 U.S.C. 154(b) by 687 days.

(21) Appl. No.: 11/844,133

(22) Filed: Aug. 23, 2007

(65) Prior Publication Data
US 2009/0051348 A1 Feb. 26, 2009

(51) Int. Cl.
*H04B 1/10* (2006.01)

(52) U.S. Cl. .................. 455/307; 455/306; 455/296

(58) Field of Classification Search .......... 455/307, 455/306, 339, 340, 296, 311; 333/165, 172, 333/175, 180
See application file for complete search history.

(56) References Cited

U.S. PATENT DOCUMENTS

| | | | |
|---|---|---|---|
| 3,760,287 A | 9/1973 | Harris | |
| 5,663,675 A | 9/1997 | O'Shaughnessy | |
| 5,995,817 A | 11/1999 | Lubbe et al. | |
| 6,618,579 B1 | 9/2003 | Smith et al. | |
| 6,681,102 B1* | 1/2004 | Collier et al. | 455/296 |
| 6,771,711 B2 | 8/2004 | Kranz et al. | |
| 7,050,781 B2* | 5/2006 | Khalil et al. | 455/340 |
| 7,078,961 B2 | 7/2006 | Punzenberger et al. | |
| 7,116,159 B2* | 10/2006 | Fleischhacker et al. | 327/554 |
| 7,400,190 B2* | 7/2008 | Wang | 327/553 |

OTHER PUBLICATIONS

"Butterworth Filters," Formulations Media Inc., 2002, pp. 0-1 to 0-14.
"Crossover Network Design Formulas & Calculator," retrieved on Jul. 19, 2007 at <<http://www.carstereo.com/help/Articles.cfm?id=9>>, CarStereo.com, 2 pgs.
"Butterworth Filter," retrieved on Jul. 19, 2007 at <<http://en.wikipedia.org/wiki/Butterworth_filter>>, Wikipedia, Jul. 13, 2007, 4 pgs.

* cited by examiner

*Primary Examiner*—Sonny Trinh
(74) *Attorney, Agent, or Firm*—Lee & Hayes, PLLC

(57) ABSTRACT

Techniques for self-calibrating filtering circuits with feedback are described herein.

17 Claims, 5 Drawing Sheets

| | Real Butterworth, Real Circuit, Real C, 1.3 R-Mism | RC Reference at 75 kHz |
|---|---|---|
| 0s | 364070 | 413720 |
| 1s | 394820 | 439520 |
| 2s | 425580 | 465310 |
| 3s | 456340 | 516910 |
| 4s | 517850 | 568500 |
| 5s | 579360 | 620100 |
| 6s | 671630 | 697490 |
| 7s | 794650 | 800690 |
| 8s | 948430 | 903880 |

| | Real Butterworth, Real Circuit, Real C, 0.7 R-Mism | RC Reference at 75 kHz |
|---|---|---|
| 0s | 649750 | 658930 |
| 1s | 694320 | 681340 |
| 2s | 738900 | 726150 |
| 3s | 828050 | 748550 |
| 4s | 872620 | 793360 |
| 5s | 1006300 | 860570 |
| 6s | 1140100 | 905380 |
| 7s | 1318400 | 995000 |
| 8s | 1496700 | 1084600 |

SELF-CALIBRATING FILTER

BACKGROUND

There are many types of electrical circuits that employ filters. Circuits designed for transmitting and receiving communication signals, for example, typically include various types of filters, including low-pass filters, high-pass filters, and band-pass filters. Such communication circuits may be used in a wide variety of devices and applications, including telephones, televisions, wireless computing devices, audio devices, personal data assistants (PDAs), and any other suitable systems that communicate signals. Of course, in addition to communications circuits, many other types of electrical circuits may include filters.

It is known that the operational performance of a filter may vary depending upon several factors. For a conventional low-pass filter composed of a combination of elements (e.g. operational amplifiers, capacitors, resistors, etc.), a desired cutoff frequency of the filter may vary considerably during operation, depending upon the processing loads and environmental variations (e.g. temperature variations) experienced by the filter.

A conventional approach to handling such operational variation is to design the surrounding components of the electrical circuit in such a way that they tolerate a shift in the filter's performance. Another approach is to use a separate reference circuit to measure the filter's performance, and then selectively switch resistive or capacitive elements on or off to tune the filter's operational performance as needed. Unfortunately, such conventional approaches are not ideal and may ignore certain side effects that lead to other operational inaccuracies. Novel techniques that mitigate a filter's operational variation while also improving upon undesirable aspects of the prior art would have considerable utility.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Figure 1:
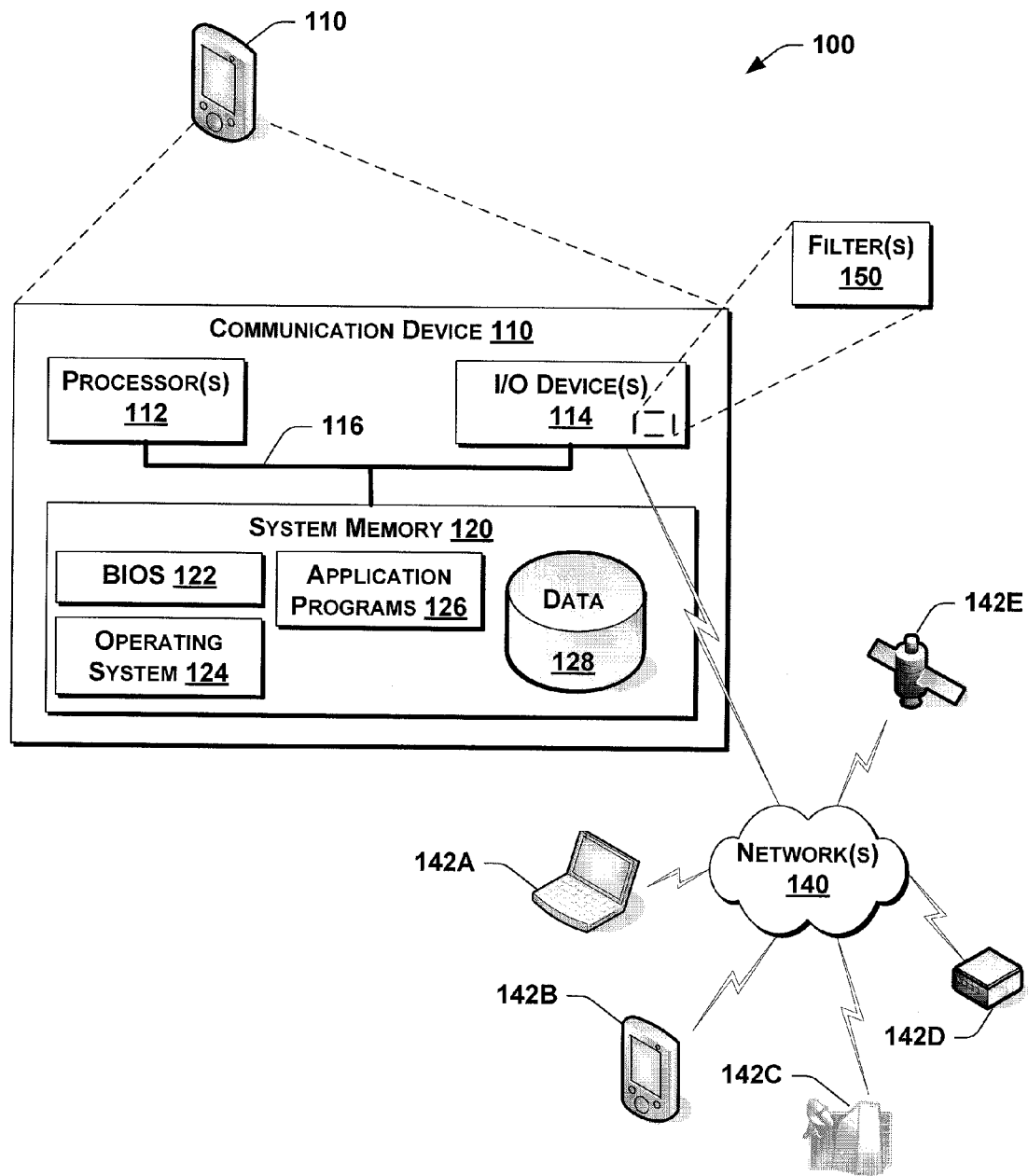
FIG. 1 is an exemplary environment in which techniques in accordance with the present disclosure may be implemented.

Disclosed herein are techniques for self-calibrating filters that correct or self-calibrate to account for performance variations due to operating conditions. In general, techniques in accordance with the present disclosure may use the filter itself as a reference for calibration, and thus, side effects may be properly considered. Such techniques may mitigate variations in a filter's operational performance while also improving on undesirable aspects of the conventional solutions.

More specifically, implementations of self-calibrating filters and filtering methods in accordance with the present disclosure may provide an additional circuit that matches a filter's passive elements. As the filter operates, its inherent vibrations are measured, and the measured vibrations provide an image of the filter's performance characteristic (e.g. cut-off frequency). In some implementations, the filter's inherent vibrations may be measured digitally. During a calibration process, the filter is exposed to parasitic effects including a target oscillation frequency. The target oscillation frequency represents the filter's operating cut-off frequency. By using the filter itself as a reference for calibration, the variations in the filter's operational performance may be mitigated and proper adjustments may be made for undesirable side effects.

According to one implementation, a self-calibrating filter circuit includes a primary filtering portion and a calibrating feedback portion. The primary filtering portion has at least one passive element and is configured to receive an input and to provide a filtered output. The calibrating feedback portion receives the filtered output and provides a feedback to the primary filtering portion. An adjustable portion has a controllable segment coupled in parallel with the at least one passive element of the primary filtering portion. During operation, the controllable segment of the adjustable portion is adjusted based on the feedback from the calibrating feedback portion. Thus, the filtered output is tuned to provide the desired filtered output using the feedback from the calibrating feedback portion of the circuit.

In another implementation, a method includes receiving a signal into a primary filtering portion of a filtering circuit, and filtering the signal using the primary filtering portion. A filtered output from the primary filtering portion is received into a secondary filtering portion, and it is determined whether the filtered output satisfies an acceptance criterion. If the filtered output does not satisfy the acceptance criterion, then the method includes analyzing the filtered output to determine a correlating adjustment, providing a feedback to the primary filtering portion characteristic of the correlating adjustment, and adjusting at least a portion of the primary filtering portion based on the feedback to at least partially improve an acceptability of the filtered output.

The techniques described herein may be implemented in a number of ways. One example environment and context is provided below with reference to the included figures and on going discussion.

Exemplary Systems

FIG. 1 illustrates an exemplary environment 100 in which techniques in accordance with the present disclosure may be implemented. In this implementation, the environment 100 includes a communication device 110 having one or more filters 150 configured in accordance with the teachings of the present disclosure. The communication device 110 operatively communicates via one or more networks 140 with a plurality of other communication devices 142. In the representative environment 100, the communication device 110 is a hand-held device, such as a cell phone, a personal data assistant (PDA), a global positioning system (GPS) unit, or other similar hand-held device, and the other communication devices 142 may include, for example, a computer 142A, another hand-held device 142B, a ground-based communication station 142C, a vehicle-mounted communication device 142D (e.g. radio, navigational unit, television, etc.), and a satellite 142E. In alternate implementations, of course, the communication devices 110, 142 may include any other suitable devices, and it is understood that any of the plurality of communication devices 142 may be equipped with filters 150 that operate in accordance with the teachings of the present disclosure.

As further shown in FIG. 1, the communication device 110 includes one or more processors 112 and one or more input/output (I/O) components 114 (e.g., keyboard, mouse, transmitter, receiver, etc.) coupled to a system memory 120 by a bus 116. In the implementation shown in FIG. 1, the filter 150 is included within the I/O component 114 of the communication device 110. In alternate implementations, the filter 150 may be integrated with any other suitable portion of the device 110, or may be a separate, individual component of the device 110.

The system bus 116 of the communication device 110 represents any of the several types of bus structures, including a memory bus or memory controller, a peripheral bus, an accelerated graphics port, and a processor or local bus using any of a variety of bus architectures. The I/O component 114 may be configured to operatively communicate with one or more external networks 140, such as a cellular telephone network, a satellite network, an information network (e.g. Internet, intranet, cellular network, cable network, fiber optic network, LAN, WAN, etc.), or any other suitable network.

The system memory 120 may include computer-readable media configured to store data and/or program modules for implementing the techniques disclosed herein that are immediately accessible to and/or presently operated on by the processor 112. For example, the system memory 120 may also store a basic input/output system (BIOS) 122, an operating system 124, one or more application programs 126, and program data 128 that can be accessed by the processor 112 for performing various tasks desired by a user of the communication device 110.

Moreover, the computer-readable media included in the system memory 120 can be any available media that can be accessed by the device 110, including computer storage media and communication media. Computer storage media may include both volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 110 (FIG. 1) may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 100 is shown as in FIG. 1 as a communication network, this implementation is meant to serve only as a non-limiting example of a suitable environment for use of the filter 150 in accordance with present disclosure. Similarly, the communication device 110 is simply one non-limiting example of a suitable device that may implement implementations of filters 150 in accordance with the present disclosure.

Exemplary Self-Calibrating Filter Circuit

Figure 2:
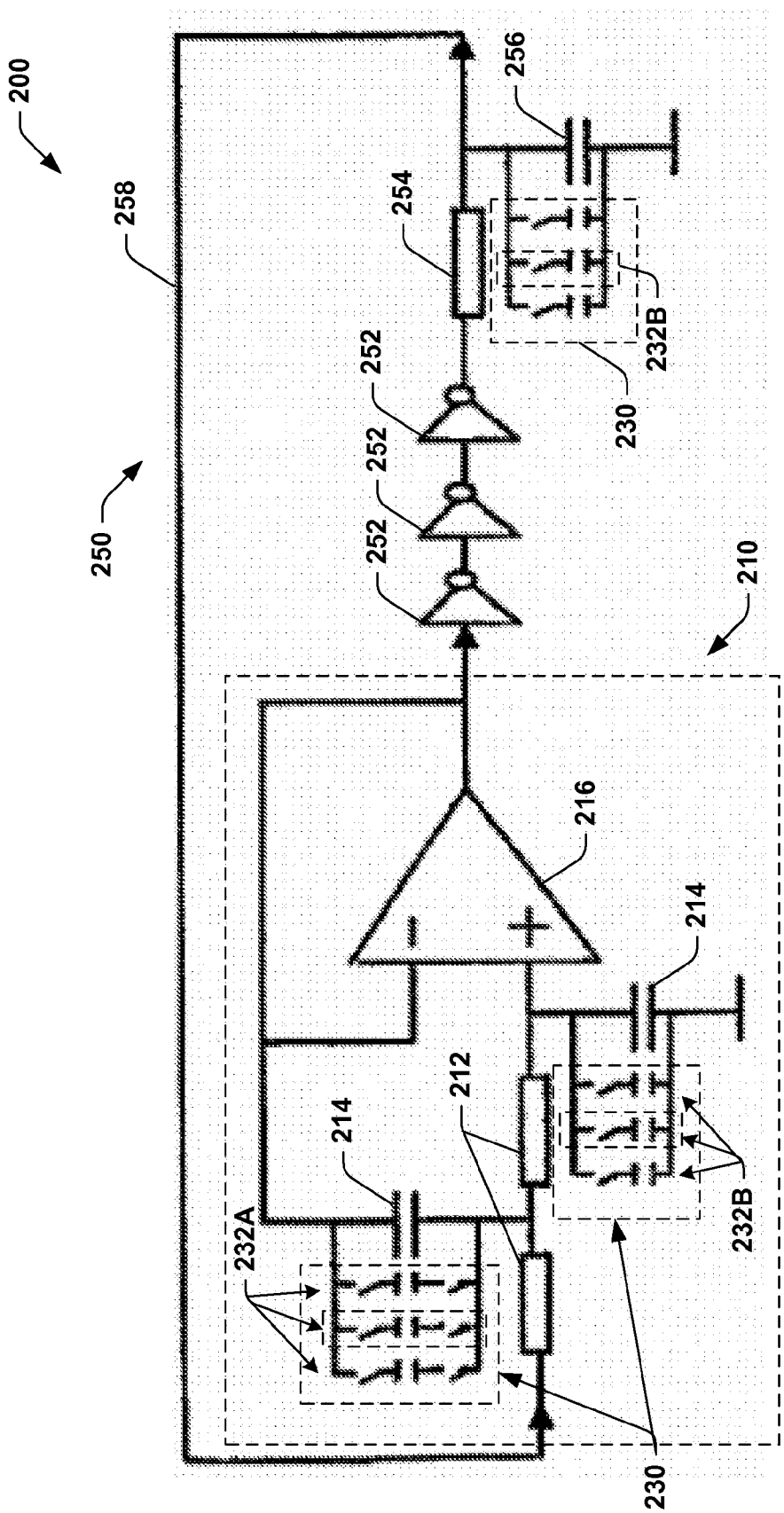
FIG. 2 is a self-calibrating filter circuit for use in the exemplary environment of FIG. 1 in accordance with an implementation of the present disclosure.

Structural and operational aspects of a self-calibrating filter circuit will now be described. For example, FIG. 2 is an exemplary self-calibrating filter circuit 200 that may be used in the exemplary environment 100 (e.g. the filter 150) of FIG. 1. In this implementation, the circuit 200 includes a primary filtering portion 210, a calibrating feedback portion 250, and a plurality of adjustable portions 230 operatively coupled to the primary filtering and calibrating feedback portions 210, 250.

The primary filtering portion 210 of FIG. 2 includes a plurality of passive elements which, in this implementation, include a pair of resistive elements 212 and a pair of capacitive elements 214 operatively configured with an operational amplifier 216. It may be noted that, in this particular implementation, the configuration of the primary filtering portion 210 is of a type generally known as a second-order Butterworth filter. In alternate implementations, however, the primary filtering portion 210 may be configured as any other suitable type of filter, including, for example, single or $n^{th}$-order Butterworth filters, Chebyshev filters, Bessel filters, Gaussian filters, or any other suitable filter types.

As further shown in FIG. 2, an adjustable portion 230 is coupled in parallel each of the capacitive elements 212 of the primary filtering portion 210. Each adjustable portion 230 includes a plurality of controllable segments 232. Although the adjustable portions 230 are depicted as having three controllable segments 232 in FIG. 2, it will be appreciated that in alternate implementations, the adjustable portions 230 may include any suitable number (e.g. one or more) of controllable segments 232. Furthermore, the adjustable portions 230 need not have an equal number of controllable segments 232, but rather, one adjustable portion 230 may have a greater number of controllable segments 232 than another. In still other implementations, the adjustable portions 230 may be coupled in parallel with other elements of the primary filtering portion 210, such as the resistive elements 212.

Figures 3, 4:
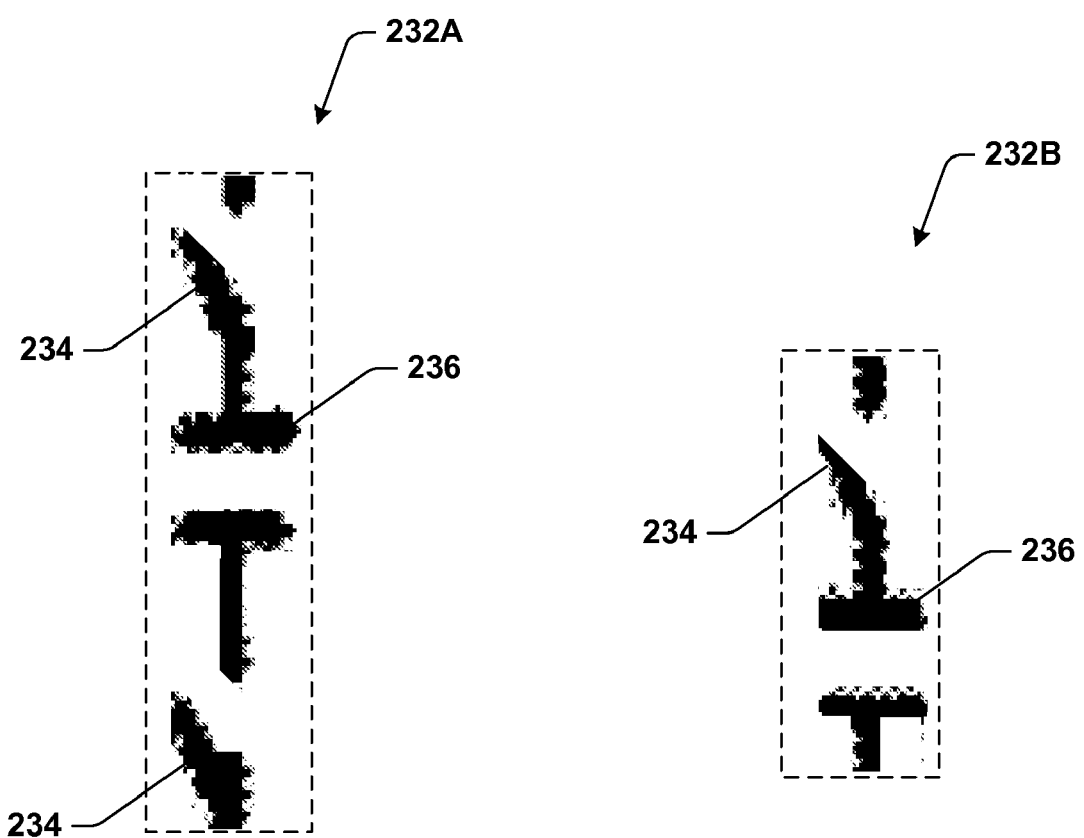
FIGS. 3 and 4 show enlarged views of implementations of controllable elements of a pair of adjustable portions of the self-calibrating filter circuit of FIG. 2.

FIGS. 3 and 4 show enlarged views of implementations of the controllable segments 232 of the adjustable portions 230 of FIG. 2. More specifically, the controllable segment 232A (FIG. 3) includes a pair of switches 234 coupled in series with a capacitor 236, while the controllable segment 232B (FIG. 4) includes a switch 234 coupled in series with a capacitor 236. In some implementations, the controllable segments 232 may exhibit strict monotony.

It will be appreciated that additional implementations of controllable segments 232 may be conceived, including implementations that use resistive elements, inductive elements, or any other suitably controllable elements. In further implementations, the controllable segments 232 may include one or more binary weighted elements (e.g. resistors, capacitors, current sources, thermo-coded elements, etc.) wherein the value of the one or more binary weighted elements may be controlled via an input value. The input value to such binary weighted elements may be variably controlled based on the operating conditions of the self-calibrating filter circuit, such as temperature conditions, processing loads, or other suitable conditions.

Referring again to FIG. 2, the adjustable portions 230 are coupled in parallel with the capacitors 214 (or other passive elements) of the primary filtering portion 210. By actuating the switches 234, the controllable segments 232 are controllably adjusted to account for performance variations of the primary filtering portion 210. In some implementations, only the capacitive elements 214 are impacted by the adjustable portions 230, and the resistive elements 212 are by-passed in order to reduce or minimize possible parasitic effects from the switches 234. In a particular implementation, nominal capacity (or nominal condition) may exist when only a fraction (e.g. approximately half) of the switches 234 of the controllable segments 232 are closed. Thus, adjustments of the adjustable portions 230 from the nominal capacity may be achieved by closing or opening switches 234 of the controllable segments 232.

The calibrating feedback portion 250 includes a plurality of inverters 252 and a resistive element 254 coupled in series to an output of the primary filtering portion 210. A capacitive element 256 is coupled in parallel with the other elements 252, 254 of the calibrating feedback portion 250, and another adjustable portion 230 is coupled in parallel with the capacitive element 256.

It will be appreciated that the calibrating feedback portion 250 forms a secondary filter that receives output signals from the primary filtering portion 210. A feedback line 258 feeds back the output of the calibrating feedback portion 250 to the primary filtering portion 210. In some implementations, a cut-off frequency of the calibrating feedback portion 250 is approximately equal to the cut-off frequency of the primary feedback portion 210 such that the calibrating feedback portion 250 approximately matches the primary feedback portion 210. In alternate implementations, however, the calibrating feedback portion 250 may have a cut-off frequency that is somewhat higher that of the primary feedback portion 210. In some implementations, static capacitive elements that are not to be switched may advantageously be equipped with a dummy switch to improve the match between the primary feedback and the calibrating feedback portions 210, 250.

In an uncalibrated state, the self-calibrating filtering circuit 200 may have an inherent natural frequency (e.g. 1 Mhz). If any parameters of the circuit 200 are changed by a technical process, the frequency response of the circuit 200 may vary, for example, by falling to a lower frequency (e.g. 900 kHz). During operation, the adjustable portions 230 may be controllably adjusted by actuating the controllable segments 232 to achieve the desired performance characteristics (e.g. frequency response of 1 Mhz). If the desired performance of the primary filtering portion 210 is achieved (or re-achieved), then the calibrating feedback portion 250 can be uncoupled or otherwise prevented from further effects on the primary filtering portion 210.

In some implementations, correlations between the observed performance characteristic of the primary filtering portion 210 and the configuration of the circuit 200 to adjust the performance characteristic to a desired (or target) level may be determined in advance using, for example, computer simulation studies. Alternately, the correlations may be determined experimentally, analytically, empirically, or using any other suitable method.

Figure 5:
FIGS. 5 and 6 show tables of exemplary correlation data determined using a conventional simulation tool.
Figure 6:

FIGS. 5 and 6 are tables of exemplary correlation data 300, 350 determined using a conventional simulation tool to model the self-calibrating filtering circuit 200 of FIG. 2. The correlation data 300 of FIG. 5 were generated assuming the resistive elements have a value of 1.3, while the correlation data 350 of FIG. 6 were generated assuming a value of 0.7. In the center columns 302, 352 of FIGS. 5 and 6 are the cut-off frequencies, and in the right columns 304, 354 are the vibrational frequencies of the calibrating feedback portion 250 in the "closed circle" or "calibrator" mode of operation.

For the exemplary correlation data 300, 350 shown in FIGS. 5 and 6, the target operational frequency of the self-calibrating filtering circuit 200 is assumed to be 700 kHz, and the resistances of the resistive elements were varied +/−30%. For the simulations shown in FIGS. 5 and 6, the capacitive elements of the adjustable portions 230 were assumed to be adjustable in +/− four linear steps.

In operation, the correlation data 300, 350 may be used to properly adjust the adjustable portions 230 based on the actual operational performance of the circuit 200 to achieve the desired operating performance. By balancing the right hand column 304 by adjusting the capacitive elements, an adjustment is obtained that causes the actual operating performance of the circuit 200 to match the desired operating performance.

Having described an exemplary environment 100 and an exemplary self-calibrating filtering circuit 200, exemplary processes for self-calibrating filtering circuits in accordance with the present disclosure will be described in the following section.

Exemplary Process

Specific implementations of exemplary methods are described below. However, it should be understood that, in alternate implementations, certain acts need not be performed in the order described, and may be modified, and/or may be omitted entirely, depending on the circumstances. Moreover, in various implementations, the acts described may be implemented by a computer, processor or other computing device based on instructions stored on one or more computer-readable media. The computer-readable media can be any available media that can be accessed by a computing device to implement the instructions stored thereon.

Figure 7:
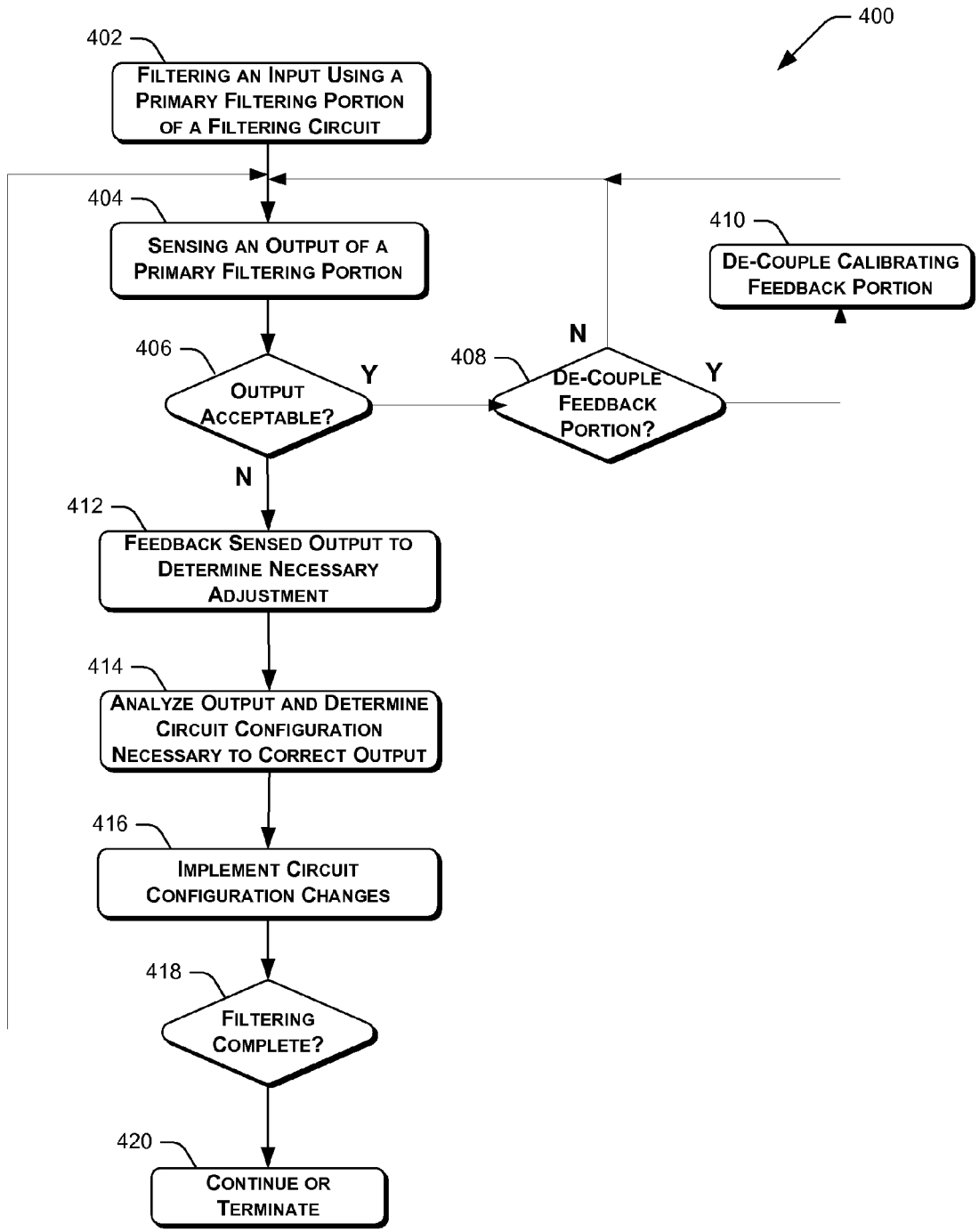
FIG. 7 is a flow chart showing a self-calibrating filtering process in accordance with another implementation of the present disclosure.

FIG. 7 is a flow chart showing a self-calibrating filtering process 400 in accordance with another implementation of the present disclosure. The process 400 is illustrated as a collection of blocks in a logical flow graph, which represents a sequence of operations that can be implemented in hardware, software, or a combination thereof. In the context of software, the blocks represent computer instructions that, when executed by one or more processors, perform the recited operations. For purposes of discussion, the process 400 is described with reference to the components of the exemplary environment 100 and the exemplary circuit 200 described above with reference to FIGS. 1 through 4.

In this implementation, the process 400 includes filtering an input using a primary filtering portion of a filtering circuit at 402. At 404, an output of the primary filtering portion is sensed using a calibrating feedback portion, and a determination is made whether the output is acceptable at 406. For example, in some implementations, the output may be analyzed to determine whether the output is at a desired operating value, or within a desired operating range.

If the output is determined to be acceptable (at 406), then the process 400 determines whether it is appropriate to decouple the calibrating feedback portion from the primary filtering portion at 408. If so, then the calibrating feedback portion is de-coupled at 410. The process 400 then returns to perform the sensing (at 404) and repeats the other above-noted activities (at 404-408).

If it is determined, however, that the output is not acceptable (at 406), then at 412, the process 400 feeds back the sensed output to determine the adjustments necessary to correct the output to the desired value. At 414, the process 400 analyzes the sensed output and determines a configuration of the circuit that is required to adjust the output to an acceptable level. For example, in some implementations, the process 400 may use a processing component (e.g. processor 112 of FIG. 1) to determine which and how many of the switches of the adjustable portions to open or close to adjust the output as desired to achieve the acceptable output. Alternately, the filter in which the self-calibrating filtering circuit is disposed may have processing or programmable logic components that perform the analysis and determination at 414.

In still other implementations, the process 400 may determine other types of adjustments (at 414) are needed to the configuration of the self-calibrating circuit required to provide the acceptable output. The analysis and determination may involve, for example, performing a table lookup, accessing simulation results, accessing information that is analytically, experimentally, or empirically derived, or any other suitable methods of determining the necessary adjustments of the circuit needed to provide an acceptable output.

At 416, the process 400 makes the adjustments to the circuit needed to provide the acceptable output. For example, in some implementations, the adjustments involve actuating one or more of the switches of the adjustable portions of the circuit. In alternate implementations, other types of circuit adjustments may be made.

After the desired adjustments are made, then at 418, the process 400 determines whether filtering is complete. If not, the process 400 returns to sensing (at 404) and the above-described actions are repeated until filtering is complete. When filtering is complete, the process 400 terminates or continues to other activities at 420.

Implementations of techniques in accordance with the present disclosure may provide significant advantages over the prior art. For example, such implementations may advantageously be calibrated without time-consuming external measurements, and external autonomous reference elements are not needed. Instead, the primary filtering portion becomes part of the measuring and calibrating loop. Parasitic effects, such as resistive element capacities that may vary according to the composition of the resistive element (e.g. substratum), as well as delays and operational amplifier cut-off frequencies, are also properly taken into account.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. Accordingly, the scope of the invention should not be limited by the disclosure of the specific implementations set forth above. Instead, the invention should be determined entirely by reference to the claims that follow.

I claim:

1. A filter circuit, comprising:
a primary filtering portion having at least one passive element and being configured to receive an input and to provide a filtered output;
a calibrating feedback portion coupled to receive the filtered output and to provide a feedback to the primary filtering portion, the calibrating feedback portion includes at least one amplifier element coupled to receive the filtered output, a resistive element coupled in series with the at least one amplifier element, a capacitive element coupled in parallel with the resistive element, and an adjustable portion coupled in parallel with the capacitive element; and
another adjustable portion having at least one controllable segment coupled in parallel with the at least one passive element of the primary filtering portion, the controllable segment being adjustable based on the feedback from the calibrating feedback portion to provide an adjusted filtered output from the primary filtering portion.

2. The filter circuit as recited in claim 1, wherein the at least one passive element of the primary filtering portion includes a capacitive element, and wherein the primary filtering portion further includes at least one resistive element, and at least one operational amplifier operatively configured with the capacitive element.

3. The filter circuit as recited in claim 2, wherein the at least one resistive element and the at least one operational amplifier are operatively configured with the capacitive element of the calibrating feedback portion as a Butterworth filter.

4. The filter circuit as recited in claim 1, wherein the at least one adjustable portion in the primary filtering portion includes a plurality of controllable segments coupled in parallel with the passive element.

5. The filter circuit as recited in claim 4, wherein each of the plurality of controllable segments includes a capacitor and a controllable switch.

6. A filter circuit as recited in claim 1, wherein the adjustable portion in the calibrating feedback portion includes a plurality of controllable segments coupled in parallel with the capacitive element, each of the plurality of controllable segments includes a capacitor and a controllable switch.

7. An electronic device, comprising:
a processor;
a communication component operatively coupled to the processor and configured to receive input signals and to transmit output signals; and
a filter circuit coupled to the communication component and configured to perform a desired filtering of at least one of the input signals and the output signals, the filter circuit including:
a primary filtering portion having at least one passive element and being configured to receive an input and to provide a filtered output;
a calibrating feedback portion coupled to receive the filtered output and to provide a feedback to the primary filtering portion, the calibrating feedback portion includes at least one calibrating element, and an adjustable portion having a controllable segment coupled in parallel with the calibrating element, the controllable segment of the calibrating feedback portion is controllably adjusted by the processor to provide a match between the primary filtering portion and the calibrating feedback portion; and
an adjustable portion of the primary filtering portion having at least one controllable segment coupled in parallel with the at least one passive element of the primary filtering portion, the controllable segment being controllably adjustable based on the feedback from the calibrating feedback portion.

8. The electronic device as recited in claim 7, wherein the at least one passive element includes a capacitive element, and wherein the primary filtering portion further includes at least one resistive element and at least one operational amplifier operatively configured with the capacitive element.

9. The electronic device as recited in claim 7, wherein the adjustable portion of the primary filtering portion includes a plurality of controllable segments coupled in parallel with the at least one passive element.

10. The electronic device as recited in claim 7, wherein the controllable segment of the adjustable portion of the primary filtering portion is operatively controlled by the processor based on the feedback.

11. A method, comprising:
- receiving a signal into a primary filtering portion of a filtering circuit;
- filtering the signal using the primary filtering portion;
- receiving a filtered output from the primary filtering portion into a secondary filtering portion, the secondary filtering portion includes at least one amplifier element coupled to receive the filtered output, a resistive element coupled in series with the at least one amplifier element, a capacitive element coupled in parallel with the resistive element, and an adjustable portion coupled in parallel with the capacitive element;
- determining whether the filtered output satisfies an acceptance criterion;
- if the filtered output does not satisfy the acceptance criterion, then:
- analyzing the filtered output to determine a correlating adjustment;
- providing a feedback to the primary filtering portion characteristic of the correlating adjustment; and
- adjusting at least a portion of the primary filtering portion based on the feedback to at least partially improve an acceptability of the filtered output.

12. The method as recited in claim 11, wherein adjusting at least a portion of the primary filtering portion includes adjusting the adjustable portion coupled in parallel with a passive element of the primary filtering portion, the passive element including at least one of a capacitive element and a resistive element.

13. The method as recited in claim 12, wherein adjusting the adjustable portion includes adjusting at least one of a plurality of controllable segments coupled in parallel with the passive element, each of the plurality of controllable segments including a capacitor and a controllable switch.

14. The method as recited in claim 11, further comprising amplifying the filtered output from the primary filtering portion.

15. The method as recited in claim 11, further comprising adjusting at least a portion of a calibrating feedback portion to improve a match between the calibrating feedback portion and the primary feedback portion.

16. The method as recited in claim 11, wherein analyzing the filtered output to determine a correlating adjustment includes performing a table look up on a table of correlation data to determine the correlating adjustment.

17. The method as recited in claim 11, wherein receiving a signal into a primary filtering portion includes receiving a signal into a primary filtering portion configured as a Butterworth filter.

* * * * *